United States Patent
Yin et al.

(10) Patent No.: US 7,873,884 B2
(45) Date of Patent: Jan. 18, 2011

(54) WIRELESS EMBEDDED TEST SIGNAL GENERATION

(75) Inventors: Qizhang Yin, San Jose, CA (US); William R. Eisenstadt, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 409 days.

(21) Appl. No.: 11/911,629

(22) PCT Filed: Apr. 15, 2006

(86) PCT No.: PCT/US2006/014119

§ 371 (c)(1), (2), (4) Date: Oct. 15, 2007

(87) PCT Pub. No.: WO2006/113460

PCT Pub. Date: Oct. 26, 2006

(65) Prior Publication Data

US 2009/0125772 A1    May 14, 2009

Related U.S. Application Data

(60) Provisional application No. 60/671,893, filed on Apr. 15, 2005.

(51) Int. Cl.
*G01R 31/28* (2006.01)
*G01R 31/26* (2006.01)

(52) U.S. Cl. ...................... 714/724; 324/765

(58) Field of Classification Search ............ 714/724, 714/738; 324/765
See application file for complete search history.

(56) References Cited

U.S. PATENT DOCUMENTS

| | | | |
|---|---|---|---|
| 6,545,454 B1 | 4/2003 | Wagstaff | |
| 6,807,644 B2 * | 10/2004 | Reis et al. | 714/724 |
| 7,095,811 B1 * | 8/2006 | Shikh-Bahaei et al. | 375/340 |
| 7,162,672 B2 * | 1/2007 | Werner et al. | 714/724 |
| 7,185,244 B2 * | 2/2007 | Kojima et al. | 714/718 |
| 7,325,180 B2 * | 1/2008 | Pileggi et al. | 714/724 |
| 7,516,380 B2 * | 4/2009 | Kanter et al. | 714/731 |
| 7,565,583 B2 * | 7/2009 | Ambuehl et al. | 714/701 |
| 2002/0019962 A1 | 2/2002 | Roberts et al. | |
| 2002/0138231 A1 | 9/2002 | Wagner et al. | |
| 2005/0057271 A1 | 3/2005 | Olleta et al. | |

* cited by examiner

*Primary Examiner*—James C Kerveros
(74) *Attorney, Agent, or Firm*—Saliwanchik, Lloyd & Saliwanchik

(57) ABSTRACT

An RF/Microwave on-chip signal source for testing an integrated circuit embedded in a substrate is provided. The signal source includes an on-chip antenna embedded in the substrate to receive a signal from a signal source external to the substrate. The signal source also includes a frequency divider circuit also embedded in the substrate. The frequency divider converts one or more frequencies of the signal into an operating frequency of the integrated circuit, the signal at the operating frequency of the integrated circuit defining an on-chip test signal. The signal source further includes one or more output buffers embedded in the substrate to provide a signal interface with the integrated circuit.

20 Claims, 5 Drawing Sheets

WIRELESS EMBEDDED TEST SIGNAL GENERATION

CROSS-REFERENCE TO RELATED APPLICATIONS

This application is a §371 national stage entry of International Application No. PCT/US2006/014119, filed Apr. 15, 2006, which claims priority to U.S. Provisional Application No. 60/671,893, filed Apr. 15, 2005, both of which are hereby incorporated by reference.

FIELD OF THE INVENTION

The present invention is related to the field of integrated electronic circuits, and, more particularly, to techniques for testing integrated electronic circuits.

BACKGROUND OF THE INVENTION

Electronic circuit designers face a seemingly relentless demand for new electronic devices that can provide increasingly sophisticated capabilities and offer ever greater bandwidth operability. This demand is reflected in the drive to integrate various digital and analog components in smaller areas, using fewer chips. Indeed, a frequently-cited goal is to create an integrated system on a single chip, a so-called "system-on-a-chip" (SoC) in which a small crystal of silicon or other semiconductor material would be fabricated to carry out each of the various electronic functions of an entire system. Aided by advances in processing technologies, electronic circuit designers are moving ever closer to this goal by increasingly integrating various digital and analog components. The result is an ever increasing array of chips that integrate varied mixed-signal circuits, including integrated RF and microwave circuits.

As chips become more complex, the need for more accurate testing of such circuits will almost certainly increase. This is largely due to the fact that in most instances the expenses associated with complex testing equipment and time lost in testing are among the more significant factors contributing to the costs of designing and manufacturing new, ever more complex integrated circuits (ICs). Accordingly, if costs are to be constrained in the face of unabated demand for more complexity and more integration, there will necessarily need to be better techniques for testing mixed-signal ICs.

A key component of an embedded test capability for an RF/Microwave IC is a high-performance test signal source. Existing techniques for providing such a test signal have typically proved to be inadequate at frequencies above the 5 to 10 gigahertz (GHz) range. At these frequencies, factors such as package parasitics make it difficult to determine the best signal levels to apply with respect to an IC under test.

Conventional approaches to providing a test signal also have involved the use of an on-chip oscillator as a simple on-chip signal generator for which only dc voltages are needed to make the oscillator work. The evolving state of technology that has lead to ever smaller, ever faster complementary metal-oxide semiconductor (CMOS) devices has exposed some shortcoming in the use of on-chip oscillators. With current technology, it is possible to design a high frequency voltage-controlled oscillator (VCO) in a standard CMOS device; for example, the design of a 50 GHz CMOS VCO has been demonstrated. The VCO-based signal generation, however, suffers from problems such as frequency drift, which can seriously degrade the quality of the generated signal.

Commercial RF/Microwave signal sources have to date typically been bench-top units. For those on-chip test signal generators implemented in the digital domain, the fastest have generally been limited to frequencies of no more than around 1 GHz. Moreover, most conventional oscillator/resonator-type sources have been found to suffer from uncertain frequency drift and phase noise performance since they typically are not controllable and accessible.

It follows, therefore, that there is a need for an effective and efficient high-performance test signal source for RF/Microwave ICs. Such a source is needed, if an effective embedded test capability for RF/Microwave ICs is to be achieved.

SUMMARY OF THE INVENTION

The present invention provides a wireless on-chip test signal source as well as a method for generating a wireless embedded test signal having high quality and being capable of operation in the millimeter wave range. The on-chip test signal source provides an effective and efficient testing capability for RF/Microwave ICs. Additionally, a significant economic advantage is the opportunity for using an on-chip test signal source as provided by the present invention to test multiple ICs simultaneously using a single test source.

Conventionally, a test signal source is designed to cover a wide range of frequencies and power levels. This provides a certain flexibility that can be advantageous in the early characterization states for a device, but once the final stage for production of a device is reached, only a few worst-case frequencies or power levels are relevant for testing. The present invention provides for embedded testing in the relevant ranges, such as in the 2.4-2.5 GHz band that is important for testing 802.11b and Bluetooth devices, for example. The advantages of the present invention, moreover, can be achieved without complicated calibrations typically required with conventional techniques and without consuming significant portions of the limited "real estate" on a reduced-size chip.

One embodiment of the present invention is an RF/Microwave on-chip signal source for testing of an integrated circuit embedded a substrate. The signal source can include an on-chip antenna disposed on or in the substrate to receive a signal from a signal source external to the substrate. The signal source also can include a frequency divider circuit disposed on or in the substrate. The frequency divider circuit can convert a frequency of the signal into an operating frequency of the integrated circuit, a signal at the operating frequency of the integrated circuit defining an on-chip test signal. The signal source can further include at least one output buffer disposed on or in the substrate to provide a signal interface with the integrated circuit.

Another embodiment of the present invention comprises a method of providing a test signal in an integrated circuit embedded in a substrate. The method can include transmitting a signal from an external source and receiving the signal with an on-chip signal generator disposed on or in the substrate. The method also can include converting a frequency of the signal to an operating frequency of the integrated circuit, and relaying the signal at the operating frequency to the integrated circuit.

BRIEF DESCRIPTION OF THE DRAWINGS

There are shown in the drawings, embodiments which are presently preferred, it being understood, however, that the invention is not limited to the precise arrangements and instrumentalities shown.

DETAILED DESCRIPTION OF THE INVENTION

Figure 1:
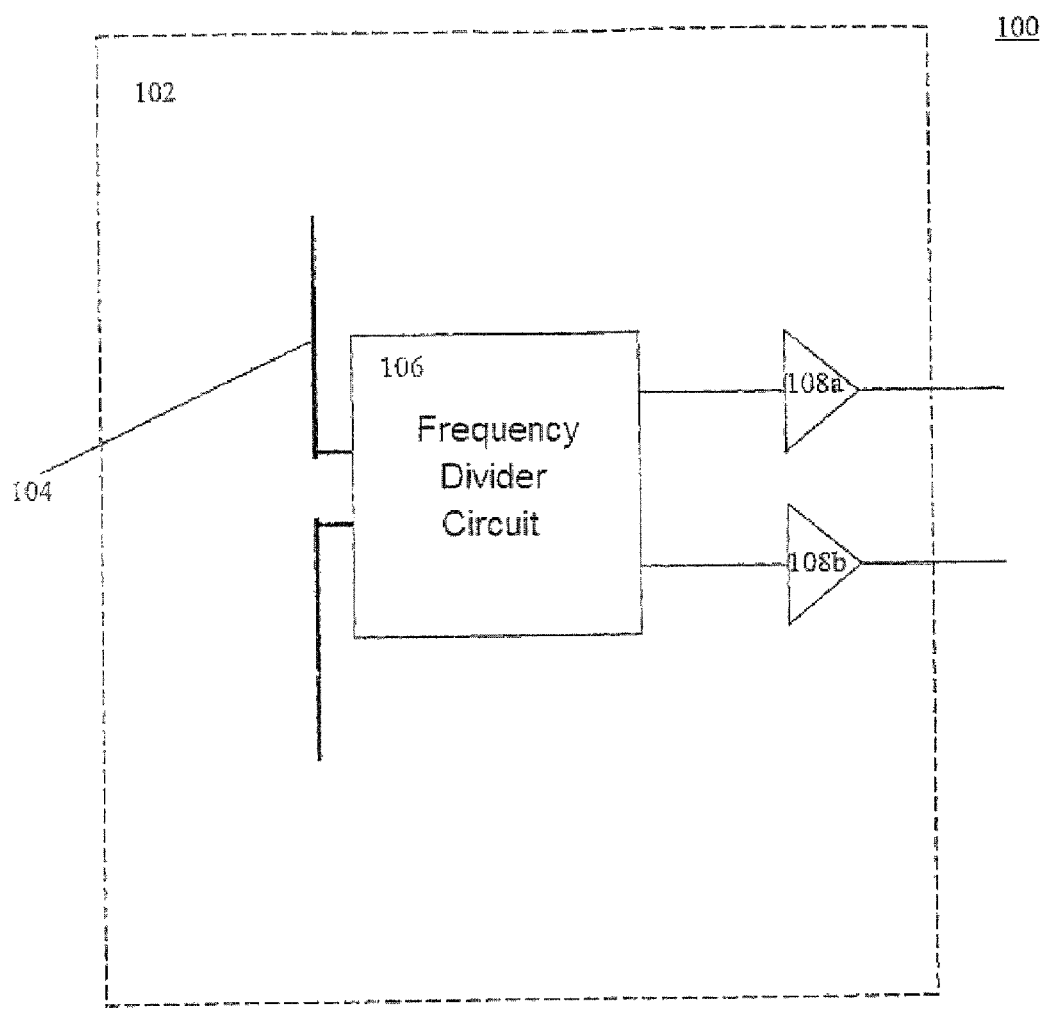
FIG. 1 is a schematic diagram of an RF/Microwave on-chip signal source, according to one embodiment of the present invention.

FIG. 1 is a schematic diagram of an RF/Microwave on-chip signal source 100 for embedded testing of an integrated circuit (IC) embedded in a substrate, according to one embodiment of the present invention. Note that, as used herein, an "embedded" component denotes an integrated circuit component disposed on or within the substrate.

The RF/Microwave on-chip signal source 100 illustratively includes a substrate 102, in which is embedded the one or more components of the integrated circuit (not shown) that is to undergo embedded testing as described herein. The RF/Microwave on-chip signal source 100 further illustratively includes an on-chip antenna 104 embedded in the substrate 102 and a frequency divider circuit 106 also embedded in the substrate and electrically connected to the on-chip antenna. Additionally, the RF/Microwave on-chip signal source 100 illustratively includes a pair of output buffers 108a, 108b embedded in the substrate 102 and electrically connected to the frequency divider circuit 106 to provide an interface between the signal source and the rest of the IC.

Operatively, a signal is conveyed to RF/Microwave on-chip signal source 100, the signal comprising a signal generated by a signal source external to the integrated circuit and spaced apart from the substrate 102 in which both the RF/Microwave on-chip signal source and rest of the IC are embedded. The signal is received by the on-chip antenna 104 and converted by the frequency divider circuit 106 to an operating frequency of the IC.

At the operating frequency, the IC defines a circuit under test (CUT). The signal at the normal operating frequency resulting from the conversion provided with the frequency divider circuit 106 is referred to herein as an on-chip test signal. In general, the frequency of the signal transmitted from the external source and received by the on-chip antenna 104 is the input frequency of the on-chip signal source 100; the operating frequency of the CUT is actually the signal output of the on-chip signal source.

According to the arrangement of the present invention, the frequency divider circuit 106 can perform at least three advantageous functions: firstly, the frequency divider circuit 106 can enable the on-chip antenna to operate at frequencies higher than those at which the antenna would otherwise be capable of operating, which permits the size of the antenna to be reduced relative to the size that would be required with conventional techniques; secondly, the frequency divider circuit 106 can mitigate effects that the signal would otherwise have on the normal operation of the CUT since when transmitted from the external source the signal has different higher frequencies and harmonics that are each well above the operating frequency of the CUT; and, thirdly, the frequency divider circuit 106, which possesses an injection-locking property, can improve the phase noise performance of the resulting on-chip test signal generated (i.e., the signal whose frequency has been converted by the frequency divider circuit), this last factor being an especially important figure of merit for any RF/Microwave test signal source.

Figure 2:
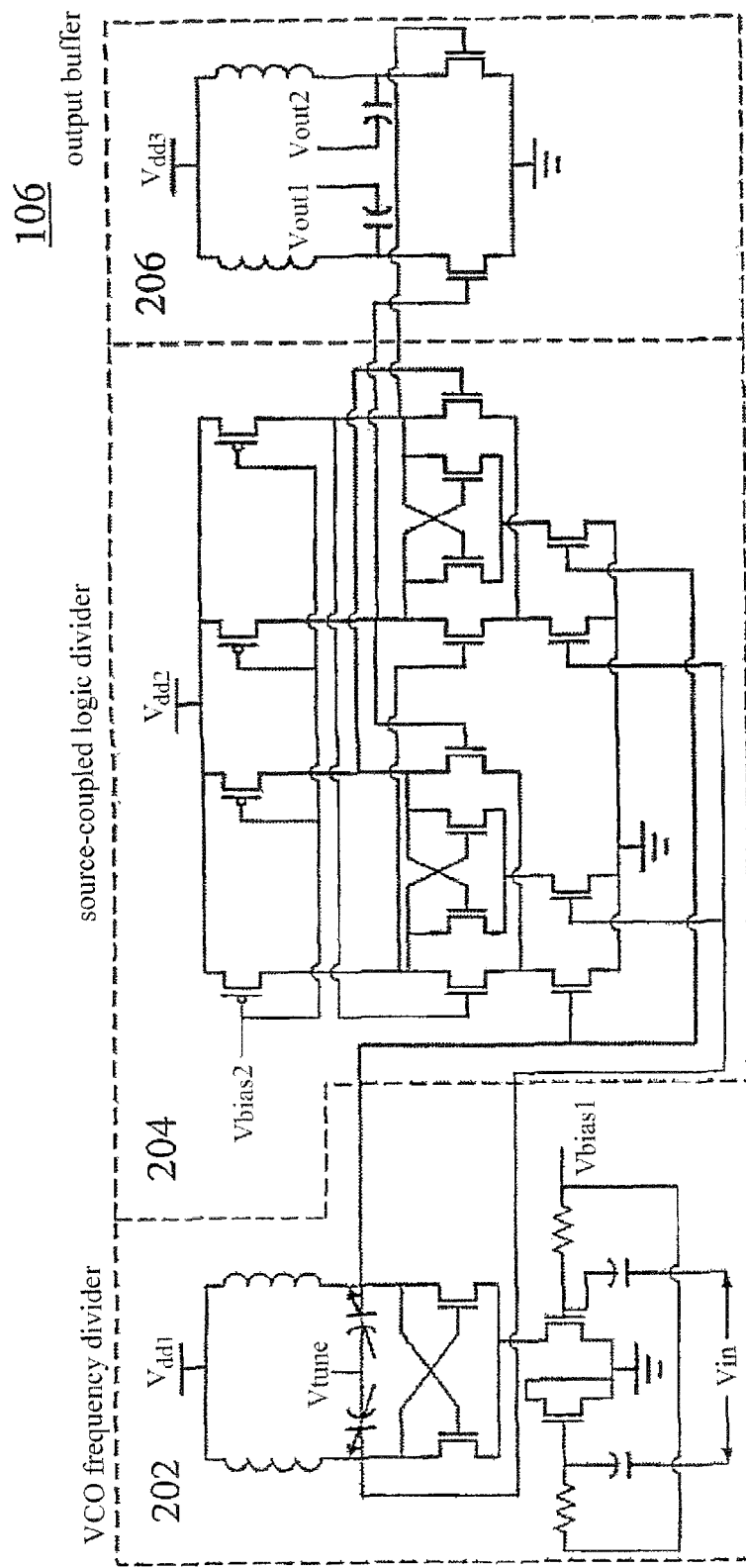
FIG. 2 is a schematic diagram of a circuit including cascaded frequency dividers and buffer for an RF/Microwave on-chip signal source, according to another embodiment of the present invention.

According one particular embodiment, the frequency divider circuit 106 comprises two cascaded frequency dividers, as in the frequency divider circuit illustrated in FIG. 2. Illustratively, the pair of frequency dividers are in a cascade arrangement with one another. The first of the pair of frequency dividers illustratively comprises an LC-based VCO frequency divider 202 having a pair of inductors, a pair of resistors, a plurality of capacitors, and a plurality of transistors as shown. The second of the pair of frequency dividers illustratively comprises a source-coupled logic divider 204 having a plurality of transistors, which as will be readily understood by one or ordinary skill in the art can from at least one flip-flop circuit component, as also shown.

Although, the source-coupled logic divider 204 is shown with two ports to the rest of the IC accessed, it will further be appreciated by one of ordinary skill in the art that as many as four ports can be accessed. The output ports can be either connected directly to the CUT as the test signal source or connected to RF detectors (not shown), which monitor the performance of the on-chip signal source.

As further illustrated in FIG. 2, the frequency dividers 204 are coupled to output buffers 206. (See also FIG. 1.) The output buffers 206 serve as an interface between the source of the test signal and the rest of the IC. Operatively, the output buffers 206 can separate the source from the other circuit components so that the performance of the source will note be adversely affected and so that, under preferred conditions, only desired test signals are sent to the CUT; bias information of the source and CUT are thus also independent. The source buffers 206 can additionally function as impedance transformers. Preferably, the impedance looking into the buffers 206 is approximately 50 ohms.

Although the biases among a last stage of frequency dividers in a frequency divider circuit 106, a CUT, and detectors (not shown) can be separated by buffers 206, the biases among the cascaded frequency dividers 202, 204 advantageously can be reused. As illustrated, the dc bias Vdd1 of the output of the LC-based VCO frequency divider 202 can bias an input of an N-channel MOS transistor of the next-stage frequency divider, the source-coupled logic divider 204. Accordingly, not only are intermediate buffer stages between the respective frequency dividers unnecessary, but even without the buffer the quality of the signal need not be degraded. Although, some signal degradation may occur with the buffers 208, the signal typically is sufficiently unadulterated to satisfy the requirements of most RF testing.

The LC-based VCO divider is an analog-based frequency divider 202, while the source-coupled logic divider 204 is a digital frequency divider, as will be readily understood by one of ordinary skill in the art. High-speed division, even at high frequencies, is a particular advantage in implementing a frequency divider circuit with such a combination. The frequency divider circuit 106, however, can alternatively be implemented using various other types of frequency dividers, including ones founded on bipolar technology as well as MOS-based frequency dividers. For example, in addition to or in lieu of a the source-coupled logic and LC VCO frequency dividers already described, the frequency divider circuit 106 can include at least one emitter-coupled logic divider.

One advantage of implementing the frequency divider 106 using digital dividers is that digital dividers consume less chip area, since there are no corresponding inductors or capacitors, while another is relative simplicity. Thus, according to yet another embodiment, the frequency divider circuit is implemented using only one or more digital frequency dividers.

Moreover, the frequency divider circuit 106 alternatively can be implemented in one, two, or more than two stages, preferably cascaded as illustrated. Thus, according to one embodiment, the frequency divider 106 comprises only a single stage. In yet another embodiment, the frequency divider 106 comprises three or more stages. Each of the stages in the latter construction can be arranged in a cascaded alignment with one another.

According to yet another embodiment, the on-chip antenna 104 comprises a reliable passive component (e.g., metal) such that the on-chip test signal can accurately track the signal as transmitted from the source external to the integrated circuit and spaced apart from the substrate 102. The on-chip antenna 104, for example, can comprise a metal pattern or metal structure disposed on or otherwise embedded in the substrate 102.

Illustratively, the on-chip antenna 104 comprises a dipole antenna. The on-chip antenna 104 alternatively can be implemented in different forms including, but not limited to, a slot antenna, loop antenna, or patch antenna (i.e., an antenna having an aperture in a ground plane whereby an electric field is excited across a slot in the antenna).

One advantage of the present invention is that the external source can be used to transmit a signal having advantageously selected characteristics. Although the gain of the on-chip antenna may be limited, if the transmitted signal has a reasonable level of power, the signal generated by the antenna is nonetheless capable of locking the followed VCO if its half frequency is sufficiently close to the free running frequency of the VCO. The stronger the injected signal, the wider the bandwidth that can be locked. Accordingly, the VCOs in a signal source according to the present invention function as frequency dividers and signal transformers such that they change the signal frequency as generated by the antenna into the operating frequency of the CUT while amplifying the signal without degrading the performance of the signal. According to test needs, several frequency dividers can be cascaded with one another, as described above.

Simulation Results

Figure 3:
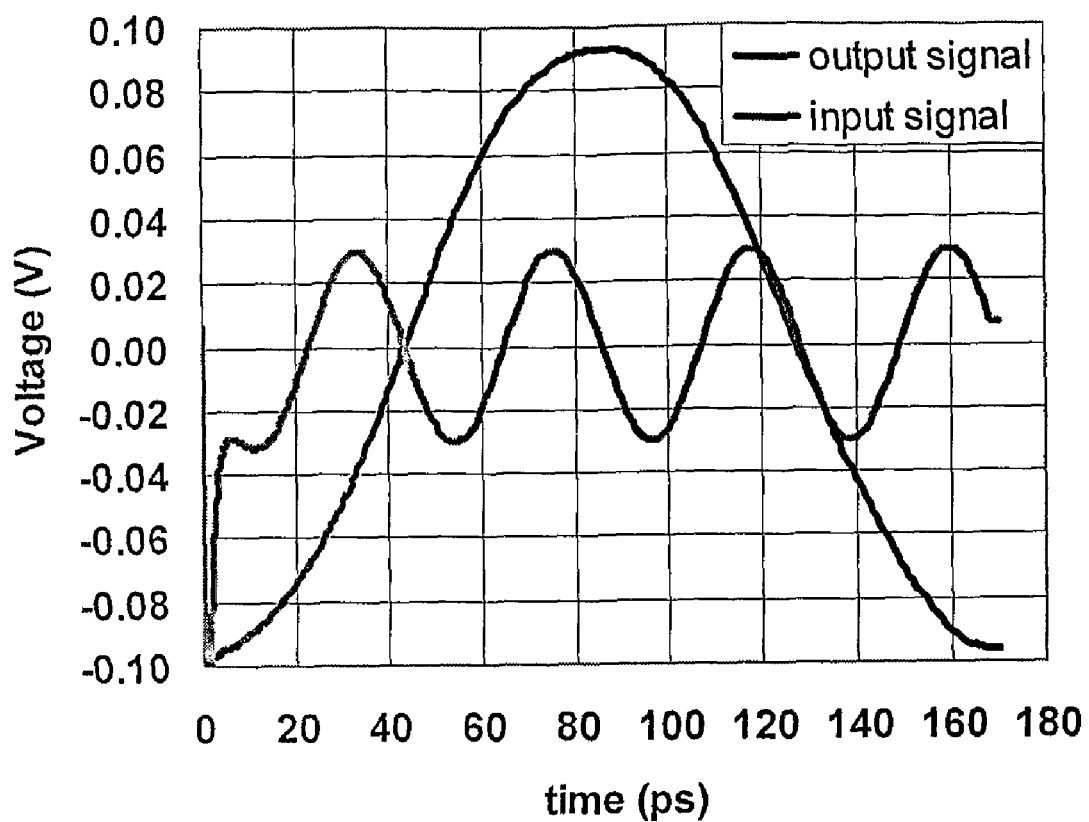
FIG. 3 is plot of a waveform of a one-period output signal and a waveform of a four-period input signal, the waveforms simulating aspects on an RF/Microwave on-chip signal source according to one embodiment of the present invention.
Figure 4:
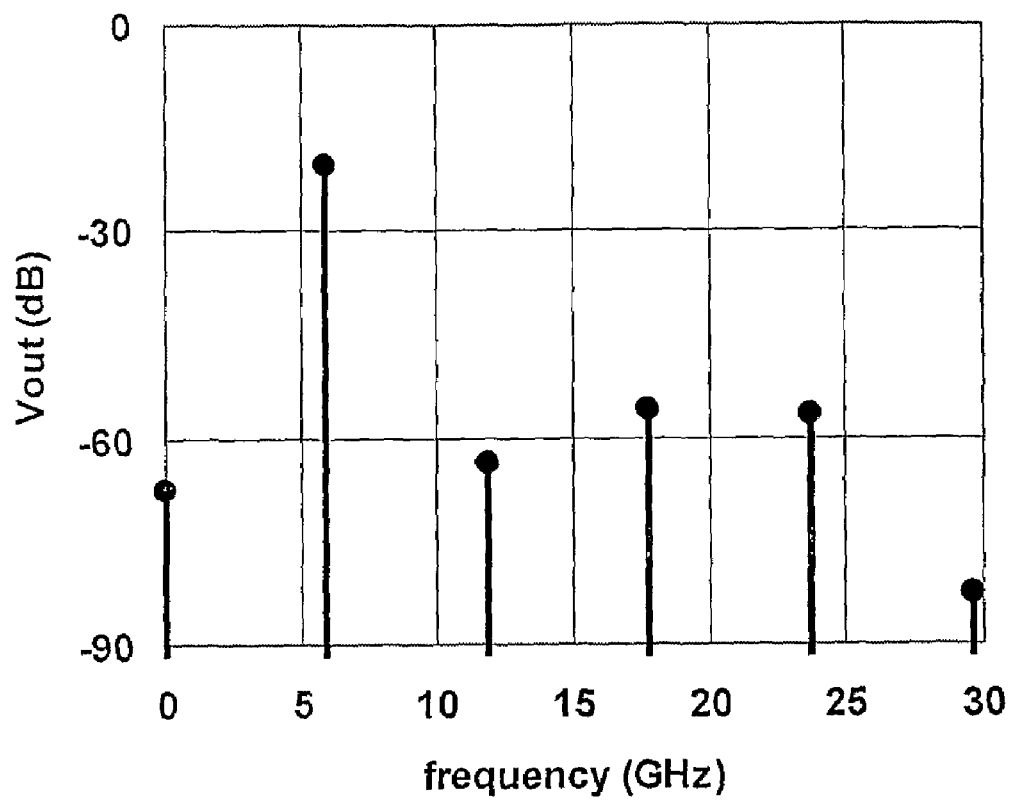
FIG. 4 is a plot of frequency harmonics of an output signal produced with an RF/Microwave on-chip signal source according to one embodiment of the present invention.
Figure 5:
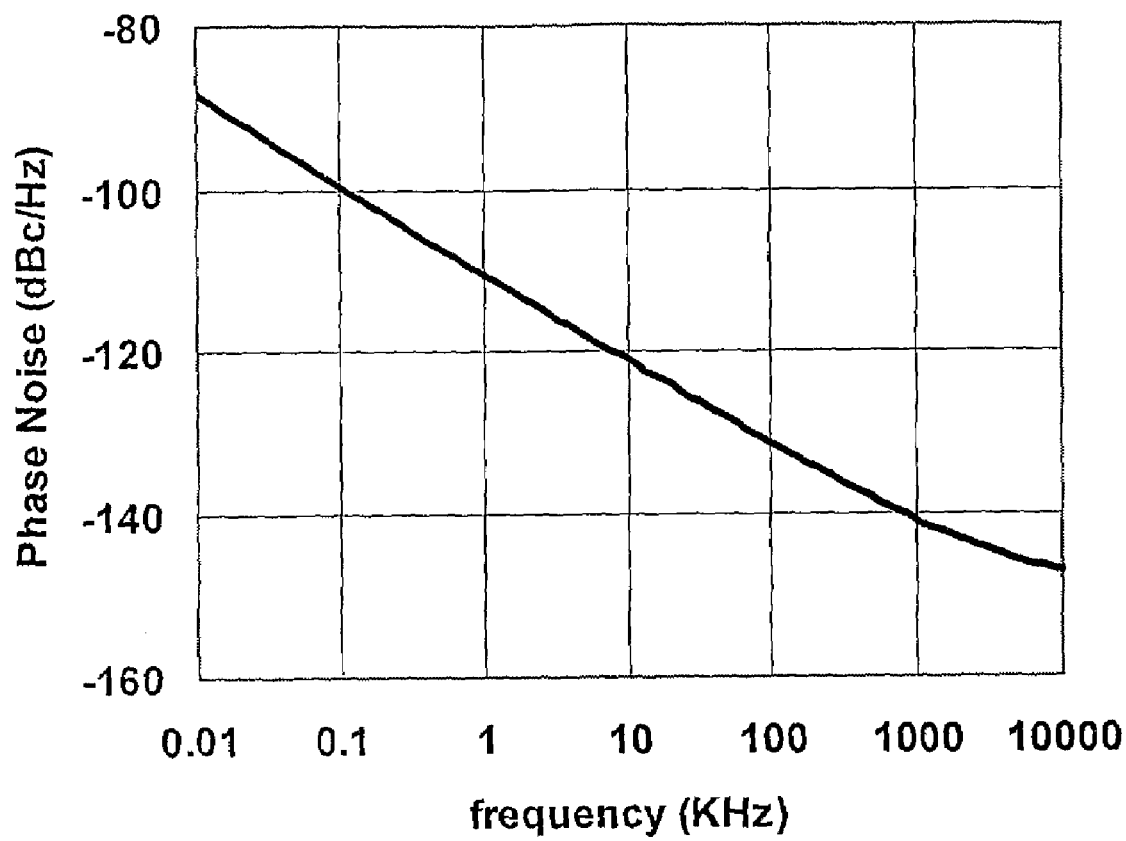
FIG. 5 is a plot of the phase noise performance of a signal source according to one embodiment of the present invention.

An RF/Microwave on-chip signal source according to one particular embodiment of the present invention was simulated, the results being those shown in FIGS. 3-5 and set forth in Table 1.

TABLE 1

| Bias Setup & Input Signals of Simulations | | | |
|---|---|---|---|
| Parameter | Value | Parameter | Value |
| $V_{in}$ | −20 dBm at 23.7 GHz | $V_{tune}$ | 0.85 V |
| $V_{bias1}$ | 0.65 V | $V_{bias2}$ | 0.0 |
| $V_{dd1}$ | 1.2 V | $V_{dd2}$ | 1.8 V |
| $V_{dd3}$ | 1.2 V | | |

The on-chip antenna was simulated as operating in the range of 24 GHz. The particular embodiment of the RF/Microwave on-chip signal source comprises two cascaded divide-by-2 frequency dividers and connected buffers. The resulting output signal simulated was around 6 GHz. The bias voltages were as set forth in Table 1. FIG. 3 is plot of a waveform of a one-period output signal and a waveform of a four-period input signal. FIG. 4 is a plot of the frequency harmonics of the output signal produced. FIG. 5 is a plot of the phase noise performance of the signal source.

The present invention can be embodied in other forms without departing from the spirit or essential attributes thereof. Accordingly, reference should be made to the following claims, rather than to the foregoing specification, as indicating the scope of the invention.

The invention claimed is:

1. An RF/Microwave on-chip signal source for testing an integrated circuit embedded in a substrate, the signal source comprising:
   an on-chip antenna embedded in the substrate with the integrated circuit, the on-chip antenna being for receiving a signal from a signal source external to the substrate;
   a frequency divider circuit embedded in the substrate for converting at least one frequency of the signal received by the on-chip antenna into a test signal at an operating frequency of the integrated circuit; and
   at least one output buffer embedded in the substrate and providing a signal interface between the frequency divider circuit and the integrated circuit,
   wherein the test signal at the operating frequency of the integrated circuit is output from the frequency divider circuit, wherein the test signal is a microwave signal.

2. The signal source of claim 1, wherein the frequency divider circuit comprises at least two frequency dividers in a cascade arrangement with one another.

3. The signal source of claim 1, wherein the frequency divider circuit comprises at least one LC-based voltage-controlled (VCO) frequency divider.

4. The signal source of claim 1, wherein the frequency divider circuit comprises at least one source-coupled logic frequency divider.

5. The signal source of claim 1, wherein the frequency divider circuit comprises at least one emitter-coupled logic frequency divider.

6. The signal source of claim 1, wherein the at least one output buffer comprises a pair of parallel buffers electrically connected to the frequency divider circuit.

7. The signal source of claim 1, wherein the at least one buffer provides an impedance of approximately 50 ohms looking into the buffer.

8. The signal source of claim 1, wherein the on-chip antenna comprises a metal.

9. The signal source of claim 1, wherein the on-chip antenna comprises a dipole antenna.

10. An RF/Microwave on-chip signal source for testing an integrated circuit embedded in a substrate, the signal source comprising:
   an on-chip antenna embedded in the substrate with the integrated circuit, the on-chip antenna being for receiving a signal from a signal source external to the substrate;
   a frequency divider circuit embedded in the substrate for converting a frequency of the signal received by the on-chip antenna into a test signal at an operating frequency of the integrated circuit, the frequency divider circuit comprising at least one LC-based voltage-controlled (VCO) frequency divider and at least one source-coupled logic frequency divider; and
   at least one output buffer embedded in the substrate and providing a signal interface between the frequency divider circuit and the integrated circuit, wherein the test signal at the operating frequency of the integrated circuit is output from the frequency divider circuit, wherein the test signal is a microwave signal.

11. The signal source of claim 10, wherein the at least one LC-based voltage-controlled (VCO) frequency divider and at least one source-coupled logic frequency divider are arranged in a cascade with one another.

12. The signal source of claim 10, wherein the at least one output buffer comprises a pair of parallel buffers electronically connected to the frequency divider circuit.

13. The signal source of claim 10, wherein the at least one buffer provides an impedance of approximately 50 ohms looking into the buffer.

14. The signal source of claim 10, wherein the on-chip antenna comprises a metal.

15. The signal source of claim 10, wherein the on-chip antenna comprises a dipole antenna.

16. A method of providing a test signal in an integrated circuit embedded in a substrate, the method comprising:
   transmitting a signal;
   receiving the signal with an on-chip signal generator embedded in the substrate with the integrated circuit;
   converting a frequency of the received signal into a test signal at an operating frequency of the integrated circuit; and
   relaying the test signal at the operating frequency of the integrated circuit to the integrated circuit, wherein the test signal is a microwave signal.

17. The method of claim 16, wherein converting the frequency of the received signal into the test signal at the operating frequency of the integrated circuit comprises passing the signal through a frequency divider circuit.

18. The method of claim 16, wherein converting the frequency of the received signal into the test signal at the operating frequency of the integrated circuit comprises passing the signal through a frequency divider circuit having at least one LC-based voltage-controlled (VCO) frequency divider and at least one source-coupled logic frequency divider.

19. The method of claim 16, wherein converting the frequency of the received signal into the test signal at the operating frequency of the integrated circuit comprises passing the signal through a frequency divider circuit having at least one LC-based voltage controlled (VCO) frequency divider and at least one source-coupled logic frequency divider in a cascade arrangement with one another.

20. The method of claim 16, wherein receiving the signal comprises receiving the signal via an antenna comprising a metal.

* * * * *

UNITED STATES PATENT AND TRADEMARK OFFICE
CERTIFICATE OF CORRECTION

| | | |
|---|---|---|
| PATENT NO. | : 7,873,884 B2 | Page 1 of 1 |
| APPLICATION NO. | : 11/911629 | |
| DATED | : January 18, 2011 | |
| INVENTOR(S) | : Qizhang Yin and William R. Eisenstadt | |

It is certified that error appears in the above-identified patent and that said Letters Patent is hereby corrected as shown below:

Column 1,
Line 12, *Insert new paragraph:*

--GOVERNMENT SUPPORT

This invention was made with government support under NSF Grant No. 0325340 awarded by the National Science Foundation. The government has certain rights in the invention.--.

Column 2,
Line 41, "embedded a substrate." should read --embedded in a substrate.--.

Column 4,
Line 19, "by one or ordinary skill" should read --by one of ordinary skill--.
Line 33, "will note be" should read --will not be--.

Signed and Sealed this
Fifth Day of April, 2011

David J. Kappos
*Director of the United States Patent and Trademark Office*